United States Patent [19]

Hoessel et al.

[11] Patent Number: 5,356,511
[45] Date of Patent: Oct. 18, 1994

[54] PRODUCTION OF A POLYMER/METAL OR POLYMER/SEMICONDUCTOR COMPOSITE

[75] Inventors: Peter Hoessel, Schifferstadt; Klaus Harth, Altleiningen; Gerhard Hoffmann, Otterstadt; Hartmut Hibst, Schriesheim, all of Fed. Rep. of Germany

[73] Assignee: BASF Aktiengesellschaft, Ludwigshafen, Fed. Rep. of Germany

[21] Appl. No.: 92,494

[22] Filed: Jul. 16, 1993

[30] Foreign Application Priority Data

Jul. 21, 1992 [DE] Fed. Rep. of Germany ....... 4223887

[51] Int. Cl.$^5$ .............................................. B32B 31/00
[52] U.S. Cl. ..................... 156/629; 156/633; 156/634; 156/643; 156/645
[58] Field of Search ............. 156/629, 633, 634, 645, 156/643

[56] References Cited

U.S. PATENT DOCUMENTS

| | | | |
|---|---|---|---|
| 3,391,024 | 7/1968 | Pierce | 156/629 X |
| 3,981,691 | 9/1976 | Cuneo | 29/195 |
| 4,061,837 | 12/1977 | Hutkin | 428/609 |
| 4,152,477 | 5/1979 | Haruta et al. | 156/668 X |
| 4,246,693 | 1/1981 | Onuki et al. | 156/629 X |
| 4,639,285 | 1/1987 | Suzuki et al. | 156/629 X |
| 4,670,089 | 6/1987 | Hanson | 156/629 |
| 4,817,277 | 4/1989 | Hieber et al. | 29/832 |
| 4,882,202 | 11/1989 | Holtzman et al. | 156/280 X |
| 5,006,200 | 4/1991 | Chen | 156/629 |
| 5,106,454 | 4/1992 | Allardyce et al. | 156/629 |
| 5,131,987 | 7/1992 | Nitowski et al. | 156/151 X |
| 5,261,154 | 11/1993 | Ferrier et al. | 156/629 X |
| 5,275,693 | 1/1994 | Nakama | 156/644 |

FOREIGN PATENT DOCUMENTS

| | | | |
|---|---|---|---|
| 0152634 | 8/1985 | European Pat. Off. | |
| 312830 | 12/1988 | Japan | 156/629 |

OTHER PUBLICATIONS

Sacher et al., "Melallization of Polymers", 1990, pp. 1–5, 61–63, 147–149, 453–455, ACS Symposium Series.

Primary Examiner—Thi Dang
Attorney, Agent, or Firm—Keil & Weinkauf

[57] ABSTRACT

A process for producing a polymer/metal or polymer/semiconductor composite having an adhesive layer between the polymer and the metal or between the polymer and the semiconductor in which a layer of at least two different chemical elements is applied to the metal or semiconductor by vapor-deposition or cathode sputtering, then selectively or partially removing at least one chemical element of this layer in an etching process, and then applying the polymer.

8 Claims, No Drawings

PRODUCTION OF A POLYMER/METAL OR POLYMER/SEMICONDUCTOR COMPOSITE

BACKGROUND OF THE INVENTION

1. Field of the Invention

The invention relates to a process for the production of a polymer/metal or polymer/semiconductor composite of improved adhesive strength having an adhesive layer between polymer and metal or between polymer and semiconductor.

2. Description of Related Art

Due to their specific properties (for example low weight, good chemical resistance, high impact strength), polymeric materials are of considerable importance as work materials. Their excellent properties during processing by injection molding, casting, blow molding, extrusion, compression molding, etc., enable the production of articles and moldings having any desired geometry in a simple and precise manner. However, in many areas of application, in particular where specific demands are made of the electrical or magnetic properties, of the thermal conductivity or of the mechanical properties of a component, the desired property profiles can only be satisfied by polymer/metal or polymer/semiconductor composites. Due to the great differences in material properties between metals and polymers (for example coefficient of thermal expansion and modulus of elasticity) and the low physical and chemical bonding forces, the polymer/metal interface is a major weakness of these composites.

Various processes have already been disclosed for improving the adhesive strength in the polymer/metal composites (cf., for example, E. Sacher, J.-J. Pireaux, S. P. Kowalczyk, Metallization of Polymers, ACS Symposium Series 440, 1990; K. L. Mittal, J. R. Susko, Metallized Plastics 1, Plenum), namely a roughening of the polymer or of the metal layer by mechanical treatment, roughening of the polymer or of the metal layer by chemical etching (for example using a chromic/sulfuric acid mixture), roughening of the polymer or of the metal layer by physical etching (for example plasma etching), the introduction of chemical adhesion groups (for example O-containing functional groups) and deposition of intermediate layers (for example Sn, Cr, etc.).

EP-A-152 634 describes a process for the production of printed circuit boards in which metallic intermediate layers, in particular made from Cu, Ni, Ag, Zn, Al or alloys of these elements, are produced by vapor deposition or currentless deposition/electroplating, and the surfaces of these are subsequently roughened.

EP-A-237 114 describes a process for the production of an electroconductive adhesive bond in which the adhesion-promotion layer comprises transition metals from the series consisting of (I) Ti, V, Cr, Mn, Fe, Co, Ni and Cu and/or (II) Zr, Nb, Mo, Te, Ru, Rh, Pd and Ag, and is produced by electrochemical deposition or by sputtering.

These known processes have the disadvantages that the adhesion-promoting action is limited (only weak mechanical anchoring) and the areas of application of the polymer/metal composites is therefore limited.

SUMMARY OF THE INVENTION

It is an object of the present invention to durably improve the adhesive strength in polymer/metal composites for a wide range of areas of application.

We have found that, surprisingly, this object is achieved by employing in the composite an adhesion-promoting intermediate layer comprising at least two different chemical elements, and selectively or partially removing at least one chemical element of this layer in a subsequent etching process. Pores for anchoring the polymer may form at the surface of this intermediate layer.

DESCRIPTION OF THE PREFERRED EMBODIMENTS

The present invention accordingly provides a process for the production of a polymer/metal or polymer/semiconductor composite having an adhesive layer between the polymer and the metal or between the polymer and the semiconductor, which comprises applying to the metal or semiconductor a layer of at least two different chemical elements by vapor-deposition or cathode sputtering, then selectively or partially removing at least one chemical element of this layer in an etching process, and then applying the polymer.

The at least two different chemical elements are preferably applied simultaneously to the metal or semiconductor by vapor deposition or cathode sputtering.

In preferred embodiments of the process according to the invention, the different chemical elements for the production of the adhesive layer are at least one from the group consisting of boron, beryllium, magnesium and aluminum, in combination with at least one element from the group consisting of carbon, silicon, titanium and chromium, and the adhesive layer has a thickness of from 0.1 nm to 10 $\mu$m.

The polymer can be applied, in particular, by compression molding, injection molding, extrusion, calendering or casting.

The etching process can be carried out chemically by means of acids, lyes or reactive gases or with the aid of a plasma.

In further embodiments of the process according to the invention, the metal of the polymer/metal composite is a dimensionally stable, rigid metallic carrier, a flexible, sheet-like metallic carrier, a metal foil, a metallic carrier in wire or fiber form, or an article coated with a metal layer, and the polymer is employed in the form of a polymer film.

The present application also provides the use of a polymer/metal composite produced by the novel process as a composite component having improved mechanical, dynamic and/or electrical properties, and the use of a polymer/metal or polymer/semiconductor composite produced in this way for the production of composite components in machine construction, in the automotive industry or in the electrical industry, or for the production of printing plates having a high-adhesion photosensitive layer.

An essential advantage of the polymer/metal composites produced by the novel process is the pronounced mechanical anchoring of the polymer to the surface of the intermediate layer. This mechanical interaction supports the chemical interaction between polymer and metal and polymer and intermediate layer, which is generally weak, and ensures a significant improvement in the mechanical properties of the composite.

To produce the polymer-metal composite, the adhesion-promoting intermediate layer can be deposited on a metallic carrier by physical deposition of at least two different chemical elements, for example by vapor deposition, cathode sputtering or arc coating, preferably by cathode sputtering, and subsequently subjected to etch treatment. The polymer is then applied by conventional process steps, such as injection molding, extrusion, calendering, compression molding or casting.

Suitable methods for the production of the layer of at least two different chemical elements are a number of variants of cathode sputtering, such as magnetron sputtering, DC or RF sputtering, bias sputtering or reactive sputtering, and combinations thereof. In magnetron sputtering, the target to be sputtered is located in an external magnetic field, which concentrates the plasma in the area of the target and thus increases the sputtering rate. In DC or RF sputtering, the sputtering plasma is excited in a manner known peruse by DC or RF generators. In bias sputtering, a prevoltage (bias), generally negative, is applied to the molding to be coated, resulting in intensive bombardment of the molding with ions during the coating process.

Multicomponent metallic alloys are usually prepared by introducing a suitable target into the coating unit and subsequently sputtering the target in a noble-gas plasma, preferably in Ar. Suitable targets are either homogeneous alloy targets, which are produced in a known manner by melt processes or by powder-metallurgical methods, or inhomogeneous mosaic targets, which are produced by assembling relatively small fragments of different chemical composition or by laying or bonding small disk-shaped pieces of material onto homogeneous targets. Alternatively, metal alloys can be prepared by simultaneously sputtering two or more targets of different composition.

The etching of the intermediate layer can be carried out chemically or electrochemically by means of organic or inorganic acids, oxidants or basic reagents. If, for example, Al/Si layers are used, the etch treatment is preferably carried out using sodium hydroxide solution. Alternatively, the etching can be carried out using a reactive gas, or in a plasma. The etch treatment should be designed so that full or partial removal of at least one chemical element of the adhesion-promoting intermediate layer takes place in a region close to the surface. The microcavities or microflaws thereby formed in the intermediate layer can then serve as adhesion anchors for the mechanical denticulation of the polymer.

Suitable carriers for the intermediate layer according to the invention are all conductive materials. Preference is given to metallic carriers, e.g. steel, aluminum and copper.

Suitable semiconductors for the production of polymer/semiconductor composites are all solid, semiconducting materials, for example silicon and germanium.

Suitable polymers are thermoplastics and thermosets. Preference is given to thermoplastic polymers, e.g. polyesters, such as polyethylene terephthalate and polybutylene terephthalate, polyamides, poylsulfones, polyether sulfones, polycarbonates, polyethers, polyoxymethylenes, polyketones, poly(aryl)ether ketones, polymethyl methacrylate, polyethylene, polypropylene, polyvinyl chloride, polystyrene, styrene-butadiene copolymers and acrylonitrile-butadiene-styrene copolymers.

Preference is also given to reaction-curable resins or casting resins which only polymerize to completion in situ on the carrier, for example methacrylate or acrylate casting resins, polyurethane resins or epoxy resins, and high-temperature-resistant polymers, e.g. polyester imides, polyimides, polyamide imides, polybenzimidazoles and polybenzoxazoles.

Preference is also given to electronically self-conducting polymers, e.g. polypyrroles, polyanilines, polythiophenes, polyparaphenylenes, polyphenylenevinylenes and polyacetylenes, which may be in the form of polymeric salts or in doped form, i.e. as excess charges.

In an embodiment of the present invention, the adhesion-promoting intermediate layer is applied to a rigid, dimensionally stable metallic carrier. Examples of suitable carriers are plates, disks, trays, hollow articles, cubes or articles having different geometries. Possible applications are, in particular, for composite components having improved mechanical properties in motor vehicles (for example bumper systems, front ends, propeller shafts, leaf springs, seat mountings, intake pipes, etc.), aircraft (for example tail planes, fuselages, etc.) or ships. Possible applications of composite components having improved dynamic properties are in machine construction (for example shafts, gearwheels, mountings, etc.). Possible applications of composite components having improved electrical or mechanical properties are in electrical engineering (for example switches, batteries, high-power transistors, high-power diodes, insulated conductor tracks, housings, 3D circuit boards, etc.), components in microelectronics (for example components having improved encapsulation, leadframes having improved adhesion to the chip housing, microelectronic components having improved insulation layers and intermediate dielectrics, plug connectors, etc.).

In a further embodiment of the present invention, the adhesion-promoting intermediate layer is applied to a flexible, sheet-like metallic carrier. Examples of suitable carriers are sheet steel having a thickness in the range of from 0.05 to 5 mm. The novel polymer/metal composites can be used as printing plates having a high-adhesion photosensitive layer, steel belts having a high-adhesion corrosion-protection coating, paint coating, dispersion coating, print or adhesion layer.

In a further embodiment of the present invention, the adhesion-promoting intermediate layer can be employed in a laminate comprising at least one thin polymer film or polymer layer and at least one thin metal foil or metal layer. The thickness of the polymer film or polymer layer can be in the range from 10 nm to 200 $\mu$m. The thickness of the metal foil or metal layer can be in the range from 1 nm to 200 $\mu$m. A laminate of this type can be used as an information-storage medium (for example magnetic tape), thin-film capacitor, multilayer circuit boards, screening foil, theft protection, semifinished product for the production of highly permeable magnetic components (for example cores of electromagnets), transfer metallization foil, adhesive film having good electroconductivity and/or good thermal conductivity, or as a packaging film having a good permeation barrier action.

In a further embodiment of the present invention, the adhesion-promoting intermediate layer can be applied to a metallic carrier in wire or fiber form. The diameter of the wire or fiber carrier can be in the range from 0.1 $\mu$m to 10 cm. The appropriate polymer/metal composites can be used as thermoplastic or thermoset components having mechanical reinforcement and an electromagnetic screening action (for example housing of electronic equipment), elastomers of high mechanical stability (for example steel cord tires), as screening fabric or as cables having high-adhesion insulating cladding.

In the example, parts and percentages are by weight, unless otherwise stated.

EXAMPLE

A polished copper sheet (thickness 1 mm) was introduced into a commercially available cathode sputtering unit (for example an Alcatel SCM 850). A circular target having the composition $Al_{70}Si_{30}$ was introduced parallel to the copper sheet at a distance of 60 mm. The vacuum chamber of the cathode sputtering unit was evacuated to $5 \times 10^{-7}$ mbar. Argon was then admitted to a pressure of $9 \times 10^{-3}$ mbar. At a substrate temperature of 200° C. the copper sheet was first subjected to sputter-etching treatment for 10 minutes by application of an RF voltage. When the sputter-etching treatment was complete, the argon pressure was reduced to $5 \times 10^{-3}$ mbar. Application of a DC voltage (power 500 W) to the $Al_{70}Si_{30}$ target caused deposition of a layer with a thickness of 3.5 $\mu$m on the copper sheet. During this operation, the substrate temperature was held at 200° C. and the RF bias of the substrate at $-90$ V.

The layer obtained was subsequently etched by immersion for one minute in a 10% strength aqueous sodium hydroxide solution at 25° C., rinsed in distilled water and dried.

Polymethyl methacrylate granules were applied to the etched layer in a layer thickness of 200 $\mu$m by compression molding. The polymethyl methacrylate layer had very high peel strength. In the 180° peel test (peeling off of an adhesive strip, for example Scotch tape from 3M, applied to the surface of the polymethyl methacrylate layer, after folding through 180°), no delamination of the polymer layer from the substrate was observed. By contrast, a polymer layer applied to the substrate without an intermediate layer had a peel strength of zero in the peel test.

We claim:

1. A process for producing a polymer/metal or polymer/semiconductor composite having an adhesive layer between a polymer and a metal or between a polymer and a semiconductor, which comprises applying to the metal or semiconductor a layer of at least two different chemical elements by vapor-deposition or cathode sputtering, then selectively or partially removing at least one chemical element of this layer in an etching process to form an adhesion layer, and then applying the polymer.

2. A process as claimed in claim 1, wherein the different chemical elements employed for the production of the adhesive layer are at least one element selected from the group consisting of boron, beryllium, magnesium and aluminum, in combination with at least one element selected from the group consisting of carbon, silicon, titanium and chromium.

3. A process as claimed in claim 1, wherein the adhesive layer has a thickness of from 0.1 nm to 10 $\mu$m.

4. A process as claimed in claim 1, wherein the polymer is applied by compression molding, injection molding, extrusion, calendering or casting.

5. A process as claimed in claim 1, wherein the etching process is carried out chemically by means of acids, lyes or reactive gases.

6. A process as claimed in claim 1 wherein the etching process is carried out with the aid of a plasma.

7. A process as claimed in claim 1, wherein the metal in the polymer/metal composite is a dimensionally stable, rigid metallic carrier, a flexible, sheet-like metallic carrier, a metal foil, a metallic carrier in wire or fiber form or an article coated with a metal layer.

8. A process as claimed in claim 1, wherein the polymer is in the form of a polymer film.

* * * * *